(12) United States Patent
Khalaji

(10) Patent No.: US 11,792,950 B2
(45) Date of Patent: Oct. 17, 2023

(54) MODULAR UPGRADABLE LOW VOLTAGE POWER SUPPLY

(71) Applicant: Amir Khalaji, Irvine, CA (US)

(72) Inventor: Amir Khalaji, Irvine, CA (US)

( * ) Notice: Subject to any disclaimer, the term of this patent is extended or adjusted under 35 U.S.C. 154(b) by 72 days.

(21) Appl. No.: 17/340,325

(22) Filed: Jun. 7, 2021

(65) Prior Publication Data

US 2022/0232722 A1 Jul. 21, 2022

Related U.S. Application Data

(60) Provisional application No. 63/199,669, filed on Jan. 15, 2021.

(51) Int. Cl.
*H05K 7/14* (2006.01)
*H01F 27/02* (2006.01)

(52) U.S. Cl.
CPC .......... *H05K 7/1422* (2013.01); *H01F 27/02* (2013.01)

(58) Field of Classification Search
CPC ..... H01F 27/004; H01F 27/02; H05K 5/0256; H05K 5/0286
See application file for complete search history.

(56) References Cited

U.S. PATENT DOCUMENTS

| | | | |
|---|---|---|---|
| 7,759,575 B2 | 7/2010 | Jones et al. | |
| 8,611,104 B1* | 12/2013 | Mogilevski | H05K 7/1432 361/679.1 |
| 8,860,377 B2* | 10/2014 | Scheucher | H02J 7/0045 320/162 |
| 9,824,809 B2* | 11/2017 | May | H01F 27/027 |
| 9,882,249 B2 | 1/2018 | Retti | |
| 10,180,220 B2 | 1/2019 | Eddins | |
| 10,418,813 B1 | 9/2019 | King | |
| 10,454,772 B2* | 10/2019 | White | H04L 67/535 |
| 10,535,904 B2 | 1/2020 | Retti | |
| 2009/0133733 A1 | 5/2009 | Retti | |
| 2018/0259142 A1 | 9/2018 | Eddins | |
| 2018/0301766 A1 | 10/2018 | Retti | |

FOREIGN PATENT DOCUMENTS

KR 1020100063676 A 6/2010

* cited by examiner

*Primary Examiner* — James Wu
(74) *Attorney, Agent, or Firm* — Lawrence N. Ginsberg

(57) ABSTRACT

A modular power supply system including an enclosure and a casing assembly contained within the enclosure. The casing assembly includes a plurality of slots. The casing assembly is configured to accept a plurality of transformer modules configured to slide into the slots. Each of the transformer modules is of a type having a transformer module housing, and a transformer element positioned within the transformer module housing.

5 Claims, 9 Drawing Sheets

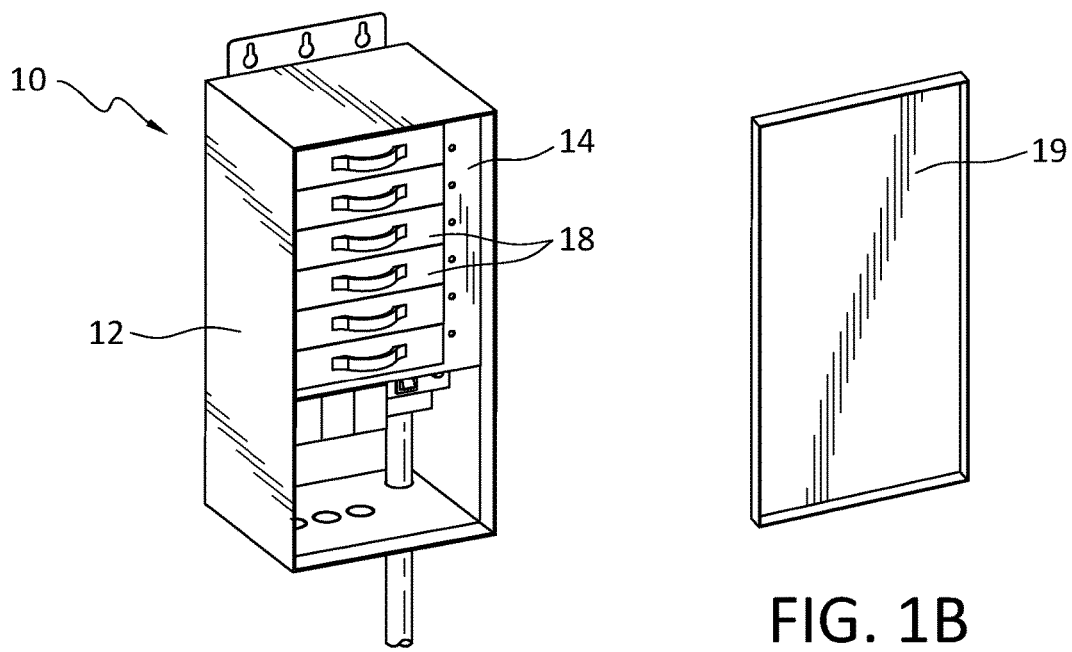
FIG. 1A
FIG. 1B
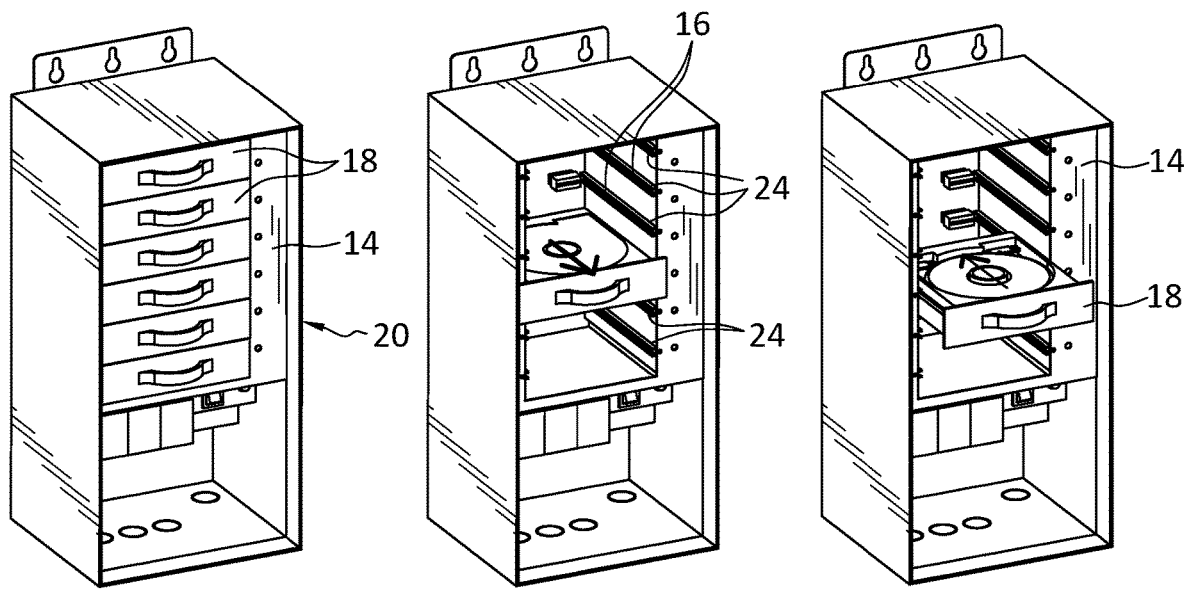
FIG. 2A FIG. 2B FIG. 2C

MODULAR UPGRADABLE LOW VOLTAGE POWER SUPPLY

CROSS-REFERENCE TO RELATED APPLICATION

This application claims the benefit of provisional patent application No. 63/199,669, entitled "MODULAR UPGRADABLE LOW VOLTAGE POWER SUPPLY" filed Jan. 15, 2021, is incorporated by reference herein in its entirety.

BACKGROUND OF THE INVENTION

1. Field of the Invention

The present invention relates generally to electrical power supplies, and more particularly to low voltage electrical power supplies. Broadly, embodiments of the present invention provide a modular upgradeable low voltage power supply. The invention allows users to modularly configure their power supply system so that it is tailored to changing power demands as power requirements expand or decrease.

2. Description of the Related Art

The following detailed description is of the best currently contemplated modes of carrying out exemplary embodiments of the invention. The description is not to be taken in a limiting sense but is made merely for the purpose of illustrating the general principles of the invention.

Most end-users or contractors would like to increase the power of their current power supply to be able to add more electrical loads. However, with existing power supplies, the user can not increase the power output of the power supply. In these cases, the user has to purchase a new power supply unit and redo the installation to increase electrical capacity.

In the event of a power supply failure, the end-user or contractor has to scrap the previous power supply unit and replace it with a new one having a capacity to meet the electrical demands. Separate power supply units occupy a lot of space, especially if a project gets expanded during installation. As can be seen, there is a need for improved low voltage power supply that is modular in construction to permit expansion and repair of the power supply.

There are various patents that have issued that have involved modular power supplies or modular transformers, but these have not involved the use of low voltage power supplies. These include, for example:

Korean Pat. Publication No. 10-2010-0063676, to General Electric Company, of New York, United States America, Shenecteddy, One River Rowd (72), entitled "Distribution System", discloses a submarine power distribution system which is stacked and interconnected to meet site expansion requirements and electrical load topology. A plurality of modular transformer building blocks are included on each of the power supply side and the subsea load side. The power distribution system includes a system DC transmission link/bus, wherein the system DC link includes a plurality of submarine load modules configured to transmit HVDC or MVDC power. The topology of the stacked modular substation on the seabed side of the subsea power distribution system is symmetric with the topology of the stacked modular substation on the land/top side of the subsea distribution system.

U.S. Pat. No. 7,759,575 B2, entitled "Expandable Power Distribution Unit", issued to Commscope Technologies LLC, discloses a power distribution unit that includes a first power box including a first chamber having a first termination zone, wherein a first wire set from a supply conduit is configured to be terminated at the first termination zone. The power distribution unit also includes a second power box ganged together with the first power box. The second power box has a second chamber open to the first chamber, and the second chamber has a second termination zone. A second wire set from at least one of the supply conduits and the first termination zone is configured to be terminated at the second termination zone.

Neither of the above examples, nor other prior art discloses low voltage modular power supplies.

As will be disclosed below, the user-friendly, modular design of the present invention helps the user configure their power supply to existing and emerging electrical power requirements.

SUMMARY OF THE INVENTION

In a broad aspect, the present invention is a modular power supply system comprising an enclosure and a casing assembly contained within the enclosure. The casing assembly includes a plurality of slots. The casing assembly is configured to accept a plurality of transformer modules configured to slide into the slots. Each of the transformer modules is of a type having a transformer module housing, and a transformer element positioned within the transformer module housing.

In a preferred embodiment the casing assembly comprises a frame assembly, a plurality of spaced rails, a plurality of terminal blocks and at least one printed circuit board. The frame assembly comprises a plurality of panel elements. The plurality of spaced rails defines the plurality of slots, the spaced rails being supported by the panel elements. The plurality of terminal blocks is supported by the panel elements. At least one printed circuit board is connected to the panel elements.

In an embodiment the at least one printed circuit board comprises a controller printed circuit board. The controller printed circuit board comprises a plurality of PCB components and a PCB mounted transformer.

The plurality of PCB components includes an MCU (Microcontroller Unit), a relay, a wireless communication technology module (e.g., Bluetooth or Wi-Fi Module), at least two output current transformers (CT's), an input current transformer (CT) and an alarm.

The MCU is configured to execute machine-readable program code for causing, when executed, the computer to perform selected steps. The relay is operatively connected to the MCU, for shutting off the power to the transformer modules. The wireless communication technology module (e.g., Bluetooth or Wi-Fi Module) is operatively connected to the MCU for communicating with a smartphone app. At least two output current transformers (CT's) are operatively connected to the MCU for measuring the output current of the modular power supply system. The input current transformer (CT) is operatively connected to the MCU to measure the input current of the modular power supply system. The alarm is connected to the MCU for making a buzzing or beeping noise for certain conditions.

The PCB mounted transformer is operatively connected to the PCB components. The PCB mounted transformer has a high voltage AC input and a low voltage AC output, the low voltage AC output being converted to DC to power the PCB components.

In another broad aspect, the present invention is embodied as a transformer module including: a transformer module housing and a transformer element positioned within the transformer module housing. The transformer module is configured to be accepted within a modular power supply system of a type having an enclosure, and a casing assembly contained within the enclosure. The casing assembly includes a plurality of slots.

Thus, the system includes a plurality of transformer modules that can be easily added or removed from a power supply system to increase or decrease the power capacity of the unit. In case one module fails, the end user can remove and easily insert a new transformer module without buying and installing a whole unit. Thus, the user is able to repair the power supply unit by easily replacing the failed transformer module, instead of scrapping the whole power supply unit.

To increase the power capacity, the user adds one or more transformer modules. To decrease the power capacity, the user can remove one or more transformer modules. The transformer module may be readily transferred to another location where additional power output may be required.

The modular low voltage power supply unit saves substantial space for contractors, distributers, etc. as there is no need to carry multiple of power supply units with redundant parts due to their being packaged in a separate power supply. Instead, the user can carry small modules for any expansions during installations.

BRIEF DESCRIPTION OF THE DRAWINGS

FIG. 1A is perspective illustration of the modular power supply system of the present invention. FIG. 1B is a perspective view of a removable lid thereof.

FIG. 2A shows the casing assembly contained within the frame assembly. FIG. 2B shows removal of and removed transformer modules from the casing assembly. FIG. 2C shows a transformer module being inserted into the casing assembly.

FIGS. 12A-12H show example screenshots taken from an app that can be utilized by a smart device to monitor and control the modular power system of the present invention.

The same elements or parts throughout the figures of the drawings are designated by the same reference characters.

DETAILED DESCRIPTION OF THE INVENTION

Figure 3A:
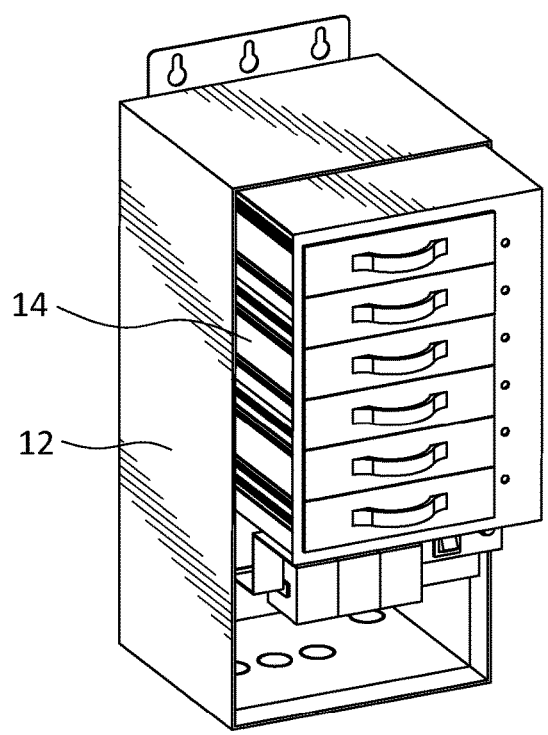
FIG. 3A shows the casing assembly partially removed from the enclosure.

Referring now to the drawings and the characters of reference marked thereon, FIGS. 1-12 illustrate a preferred embodiment of the modular power supply system of the present invention, designated generally as 10. As can be seen in FIG. 1A, the modular power supplies system 10 includes an enclosure, designated generally as 12. A casing assembly 14 is contained within the enclosure 12. The casing assembly 14 includes a plurality of slots 16 (see e.g., FIG. 2B). The casing assembly 14 is configured to accept a plurality of transformer modules 18. The enclosure 12 is preferably formed of stainless steel; however, other suitable resilient materials maybe utilized such as for example plastic, powder coated steel. Referring to FIG. 1B, the enclosure 12 includes a removable lid 19.

FIG. 2A shows the casing assembly 14 contained within a frame assembly 20. FIG. 2B shows removal of and removed transformer modules 18 from the casing assembly 14. FIG. 2C shows a transformer module 18 being inserted into the casing assembly 14.

Figure 3B:
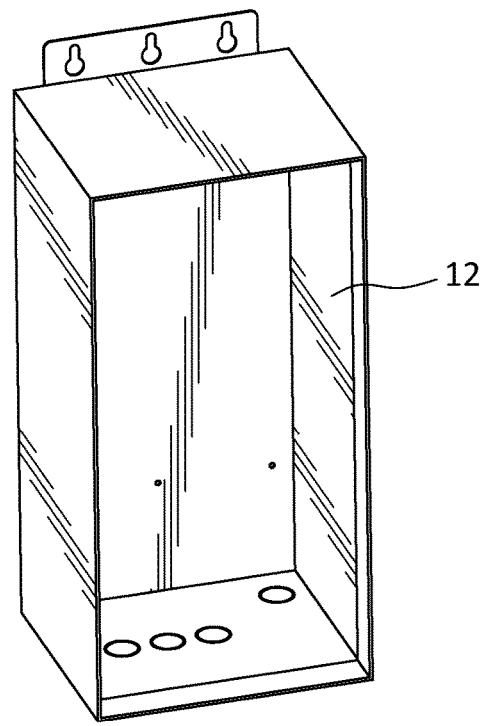
FIG. 3B shows the enclosure with the casing assembly removed therefrom.

FIG. 3A shows a casing assembly 14 partially removed from the enclosure 12. FIG. 3B shows the enclosure 12 with the casing assembly 14 removed therefrom.

Figure 4:
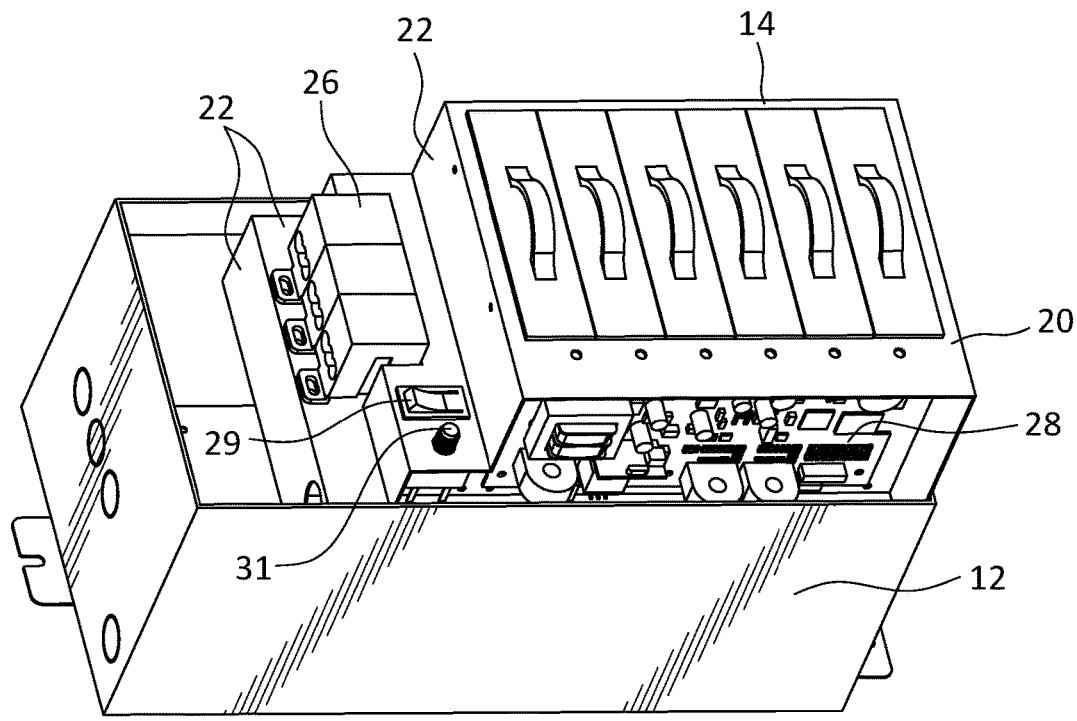
FIG. 4 is another view showing the casing assembly partially removed from the enclosure.
Figure 5:
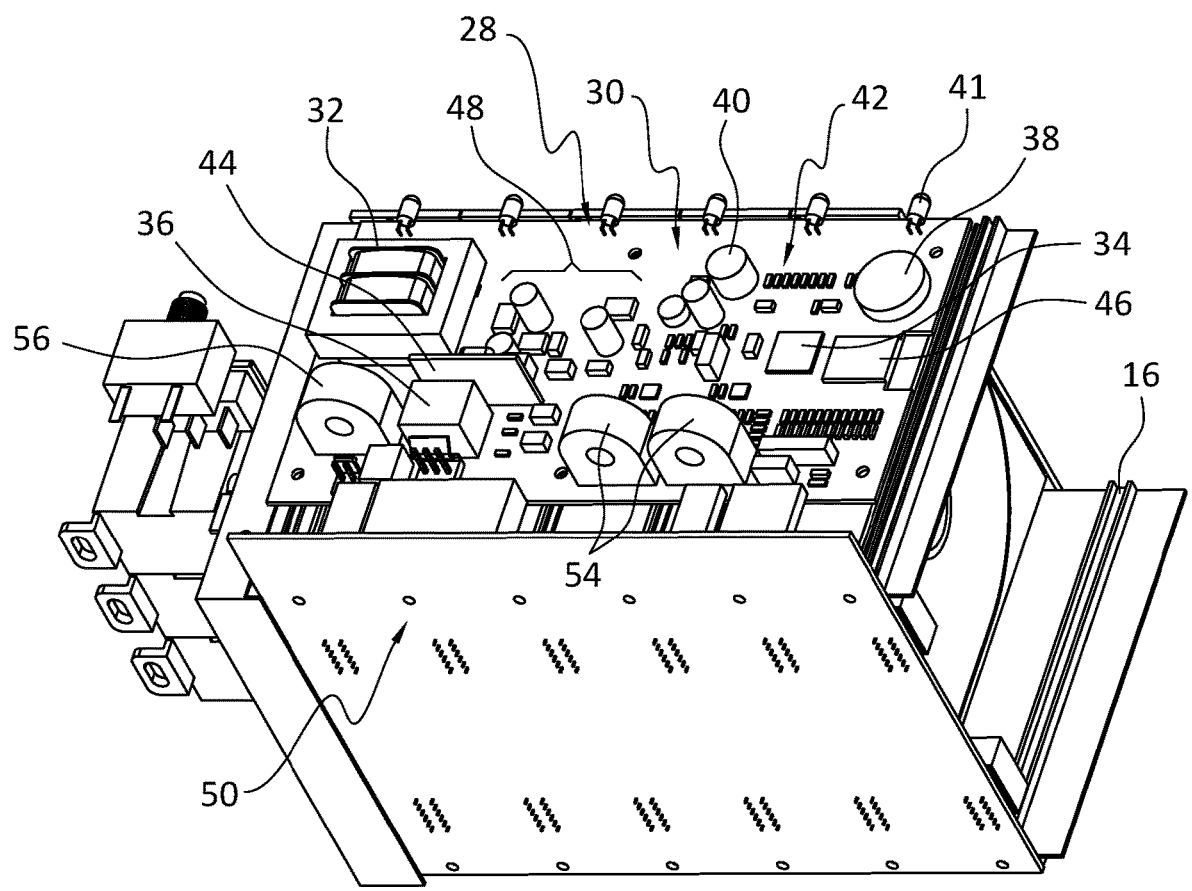
FIG. 5 shows the casing assembly removed from the enclosure, revealing the components thereon.

FIG. 4 is another view showing the casing assembly 14 partially removed from the enclosure 12. FIG. 5 shows another view of the casing assembly 14. Referring to both FIGS. 4 and 5, the casing assembly 14 includes the frame assembly 20 having a plurality of panel elements 22; a plurality of spaced rails 24 defining said plurality of slots 16 supported by the panel elements 22 (i.e. shown in FIGS. 2A-2B); a plurality of terminal blocks 26 supported by the panel elements 22; at least a printed circuit board, i.e., controller PCB 28, connected to the panel elements 22; a second PCB, i.e., a connection PCB 50, is also connected to the panel elements 22, as shown in FIG. 5; a power switch 29 supported by the panel elements 22; and, a reset button 31 supported by the panel elements 22.

As best seen in FIG. 5, the controller printed circuit board (PCB) 28 includes a plurality of PCB components, designated generally as 30, and a PCB mounted transformer 32 operatively connected to the PCB components 30. The plurality of PCB components 30 includes an MCU (Microcontroller Unit) 34 configured to execute machine-readable program code for causing, when executed, the computer to perform selected steps. The MCU 34 may be, of the ARM series type with the required I/O ports, timer, Inter-integrated circuit (I2C), pulse width modulation (PWM), Serial Peripheral Interface (SPI), and Analog-to-Digital Converter (ADC). The PCB mounted transformer 32 has a high voltage AC input and a low voltage AC output. The low voltage AC output is converted to DC to power the PCB components 30.

The set of PCB components 30 includes a relay 36 operatively connected to said MCU 34, for shutting off the power to the transformer modules. This feature will act as a circuit breaker or fuse to shut off power and protect the system from any electrical overloads or shortages. The relay may be, 5-10 Amps.

The set of PCB components 30 includes a real time clock 38 operatively connected to the MCU 34. Real time clock 38 provides the time information to the MCU 34. A preferable type of real time clock is marketed as MAXIM DS1302ZN+ or MAXIM DS1307ZN+, manufactured by Maxim Integrated.

The set of PCB components 30 includes an alarm (such as a buzzer 40 or LED indicator light 41) operatively connected to the MCU 34, for making a buzzing or beeping noise or lighting up, for certain conditions.

The set of PCB components 30 includes a EEPROM 42 operatively connected to the MCU 34, for saving the settings and history of the records. A preferable type of the EEPROM is model No. W25Q64FVSSIGE or GD GD25Q64CSIG, manufactured by WINBOND.

The set of PCB components 30 includes an energy measuring module 44 operatively connected to the MCU 34, for measuring the power consumption, current, and voltage and reporting the same to the MCU.

The set of PCB components 30 includes a wireless communication technology module, e.g. Bluetooth Low Energy (BLE) 46 operatively connected to said MCU 34, to allow the modular power supply system to communicate with a digital selected platform. However, the wireless communication technology module 46 can communicate with in various ways, for example WiFi, WiMAX, NFC, GPS, Zigbee, Satellite Communication, UWB, Mobile Communication Systems, RF, to a selected digital platform.

The set of PCB components 30 includes AC to DC convertors 48 operatively connected to the MCU 34, to convert the AC voltage to DC voltage and power up the MCU 34 and the BLE module 46.

The set of PCB components 30 includes at least two output current transformers (CT's) 54 operatively connected to the MCU 34 for measuring the output current of the modular power supply system 10. An input current transformer (CT) 56 is operatively connected to the MCU 34 to measure the input current of the modular power supply system 10.

Figure 6A:
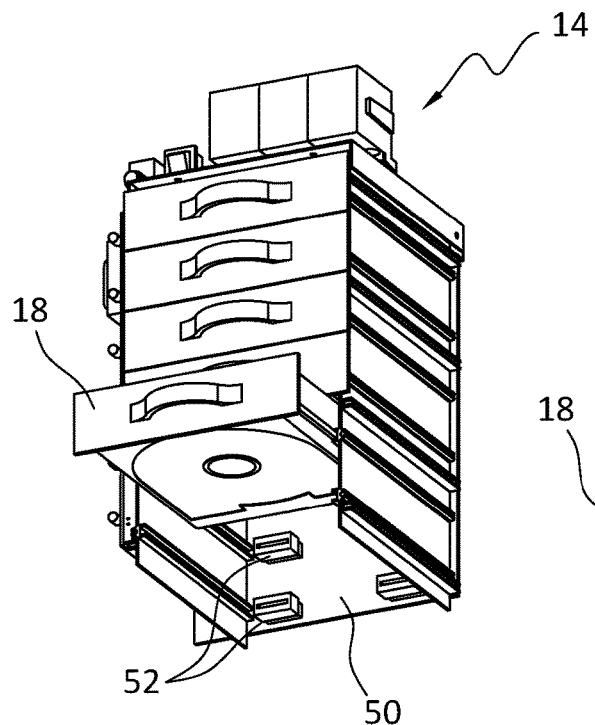
FIG. 6A shows the casing assembly removed from the enclosure, revealing the components of connection PCB and showing a transformer module partially removed.
Figure 6B:
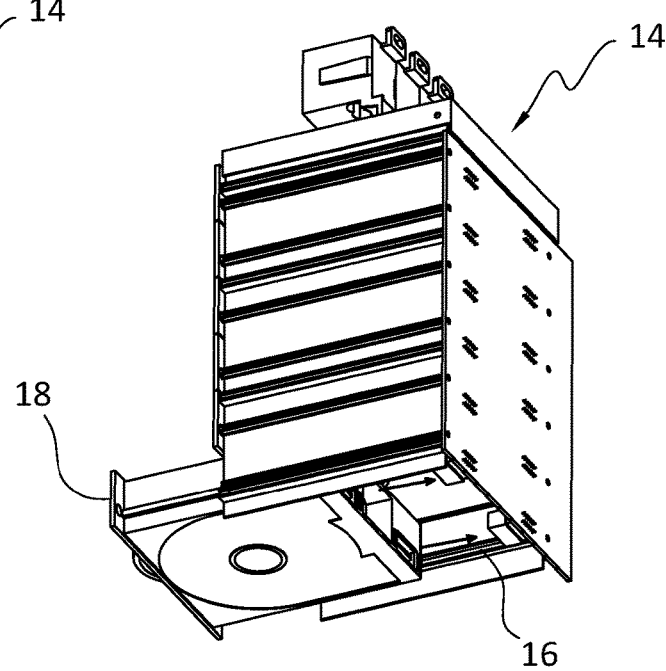
FIG. 6B is another view of the casing assembly showing a transformer module being slid into the slots.

Still referring to FIG. 5, a rear side of a connection printed circuit board (PCB) 50 can be seen. As better seen in FIG. 6A, the connection PCB 50 includes a plurality of female pluggable terminal sets 52 operatively connected in parallel to each other. One of the sets provides the input to the transformer module 18 and the other set provides the outputs to the terminal blocks 26. A preferable type of female pluggable terminal, marketed as Goldfinger Slot, is manufactured by WING TAT and identified as S-12M-2.54-5. FIG. 6B is another view of the casing assembly 14 showing a transformer module 18 being slid into the slots 16.

Figure 7:
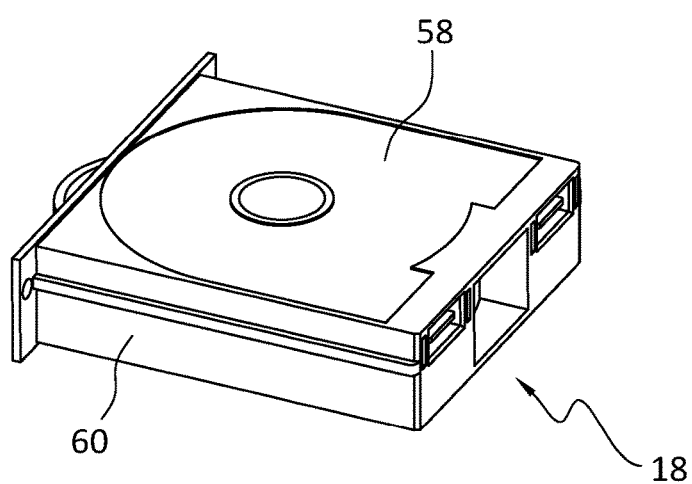
FIG. 7 is a perspective illustration of a transformer module.
Figure 8:
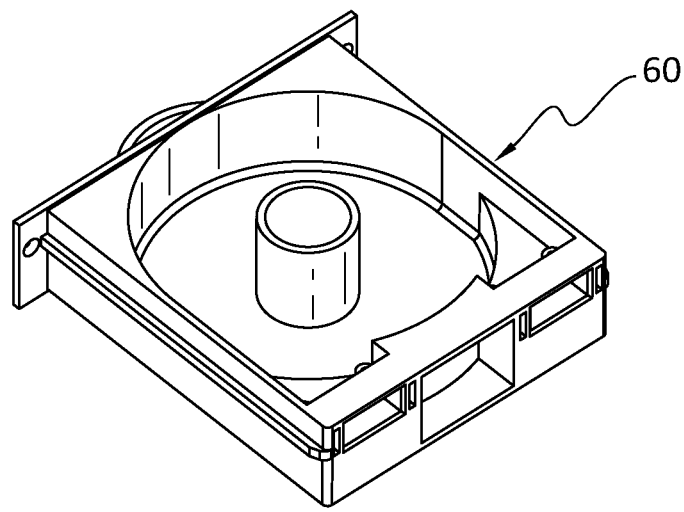
FIG. 8 shows the transformer module housing, the transformer element having been removed.
Figure 9:
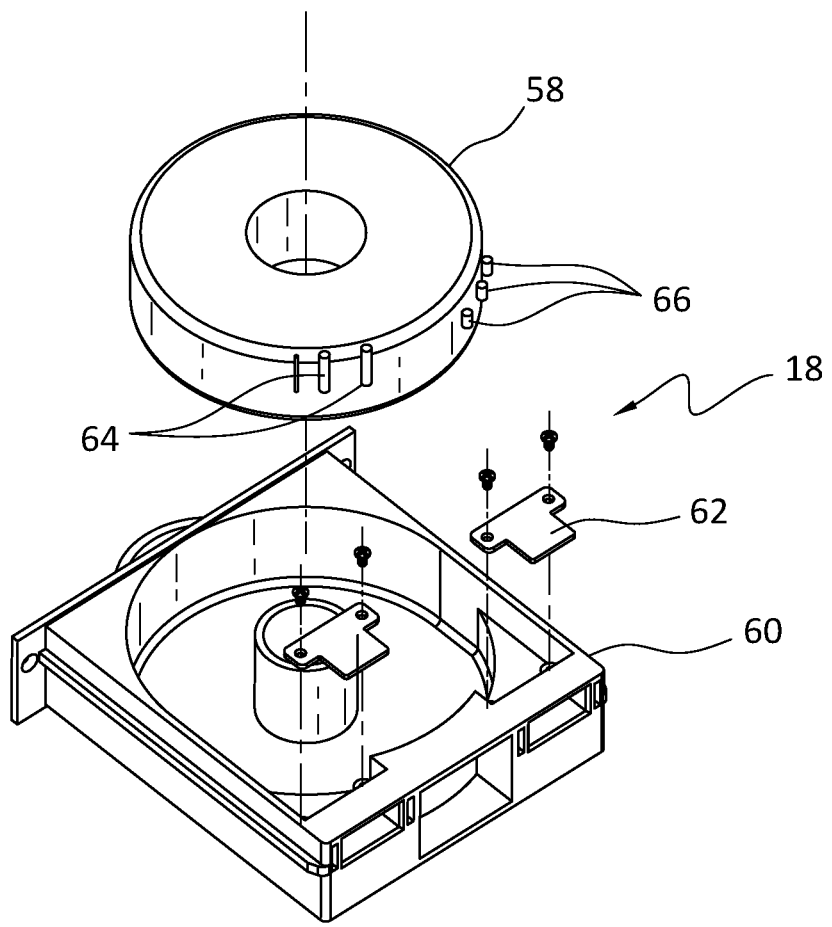
FIG. 9 is an exploded perspective view of the transformer module.

Referring now to FIG. 7, a transformer module 18 is illustrated. In FIG. 8, the transformer element 58 has been removed to reveal only a transformer module housing 60. FIG. 9 is an exploded perspective view of the transformer module 18. A Goldfinger PCB 62 is operatively connected to a transformer element 58 input lead wires 64 and to output lead wires 66.

The transformer element 58 may be, an EI-type, a UI-type, or a toroidal. The transformer element 58 may be encapsulated inside of the transformer module housing 60 by, for example, a suitable resin. The plurality of transformer modules 18 may be selectively inserted into the casing assembly 14 by supporting each of the plurality of transformer modules 18 within a pair of slots 16. Each of the transformers may then be connected to the connection PCB 50 to upgrade the unit.

Figure 10:
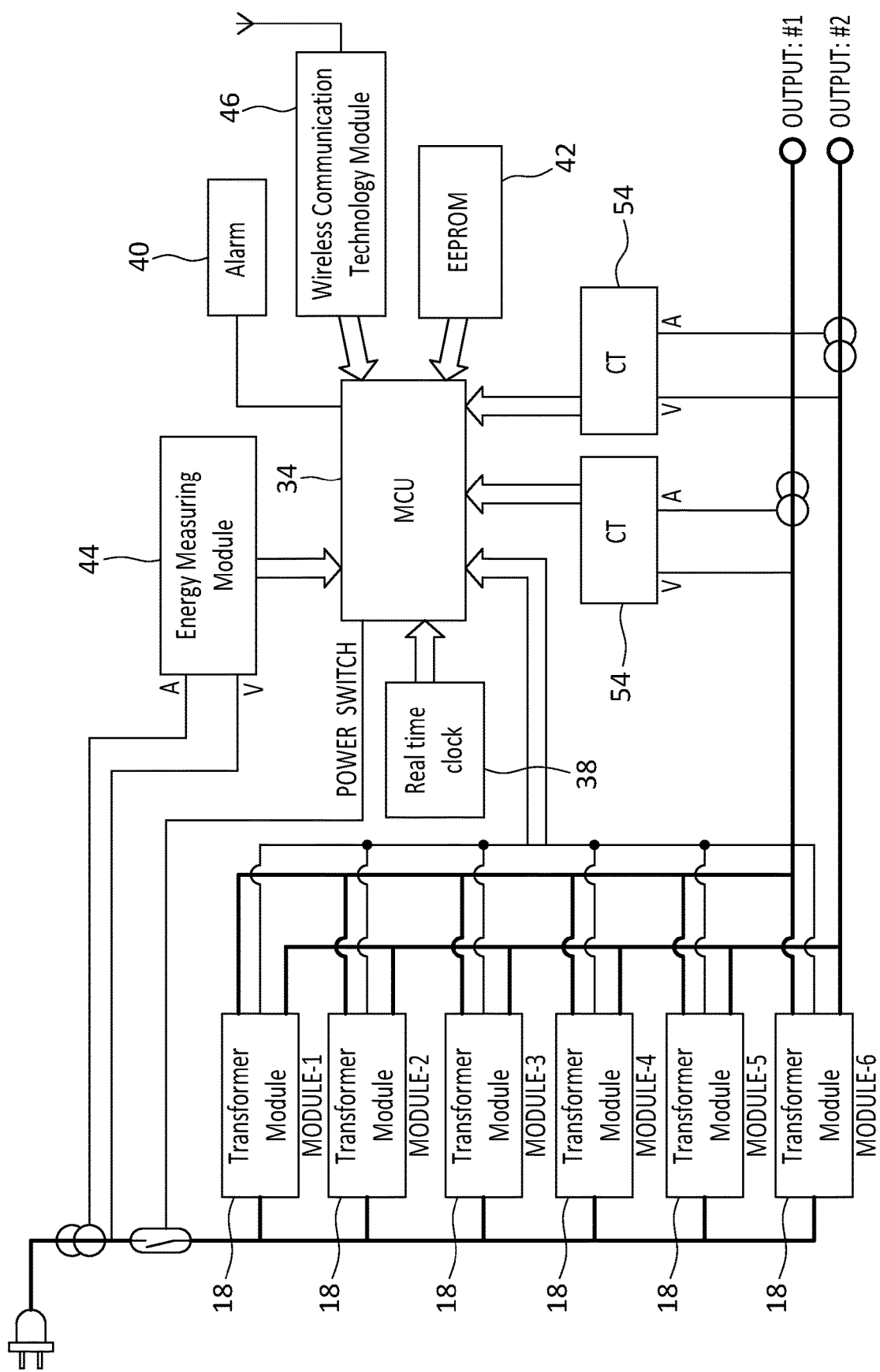
FIG. 10 shows an example hardware flowchart for in a case where there are six transformer modules transforming voltage from 110V to 15V and 12V.

Referring now to FIG. 10, a hardware flowchart is illustrated, illustrating the hardware on controller PCB 28 and connection PCB 50 that are feeding data to MCU 34. The example shown shows six transformer modules 18 (MODULE-1, MODULE-2, . . . MODULE-6) that transform voltage from 110V to 15V and 12V. It is noted that this is shown for the purposes of illustration, not limitation. The data from the energy measuring module 44, input current transformer 56, output current transformer 54, EEPROM 42, alarm 40, and wireless communication technology module 46 will be used to determine if any modules have been inserted or removed. Also, with the received data the MCU 34 will determine if the modular power supply 10 should be on or off. The relay 36 will be triggered from MCU 34 to turn the modular power supply 10 on, or off.

Figure 11:
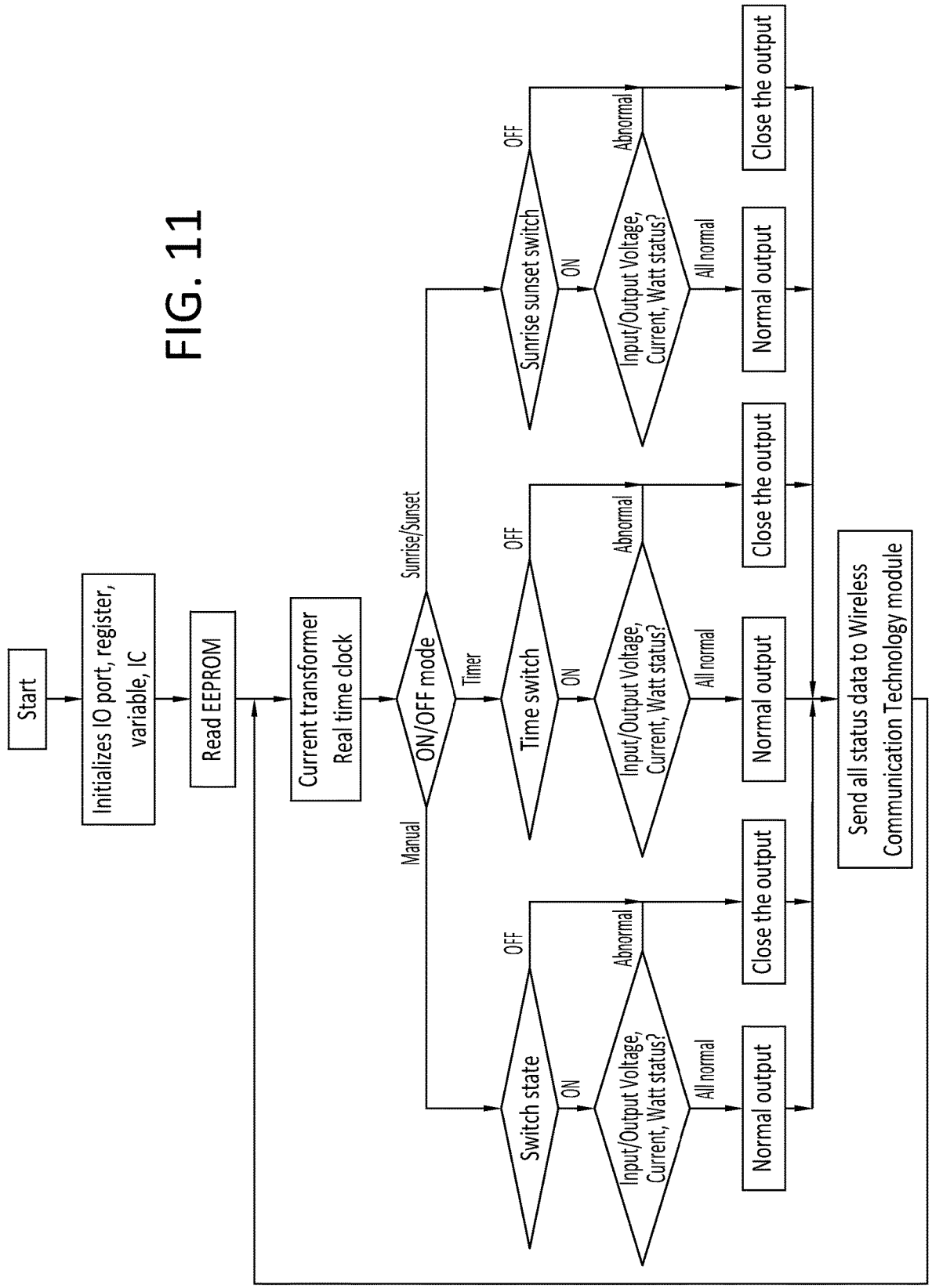
FIG. 11 shows an example software flowchart showing the steps to determine the ON and OFF mode of the modular power supply system of the present invention.

Referring now to FIG. 11, a software flowchart is illustrated to show the steps that MCU 34 takes to provide the normal output to terminal blocks 26 or shut off the power. Based on the collected variables from plurality of PCB components 30 and user selected timer option (manual or Sunrise/Sunset), MCU 34 will act accordingly.

Figures 12A, 12B, 12C, 12D:
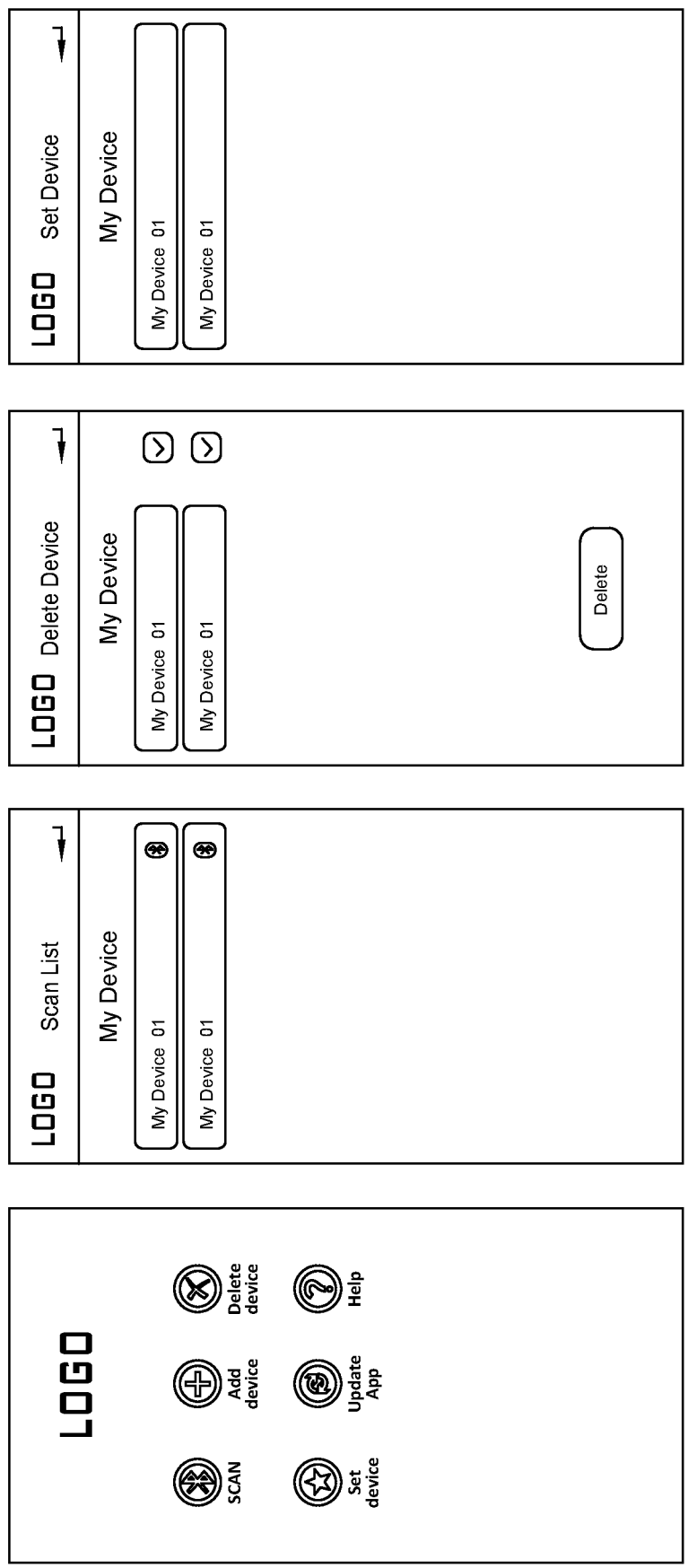

FIG. 12A is a screenshot showing the home page of the application with the buttons used to configure the system.

FIG. 12B is a screenshot showing the list of the Bluetooth Low Energy (BLE) devices that have been added to the app.

FIG. 12C is a screenshot showing the delete menu for the added Bluetooth Low Energy (BLE) devices from the app.

FIG. 12D is a screenshot showing the selection menu of the connected devices which, when clicked, will take you to the settings of the chosen device.

Figures 12E, 12F, 12G, 12H:
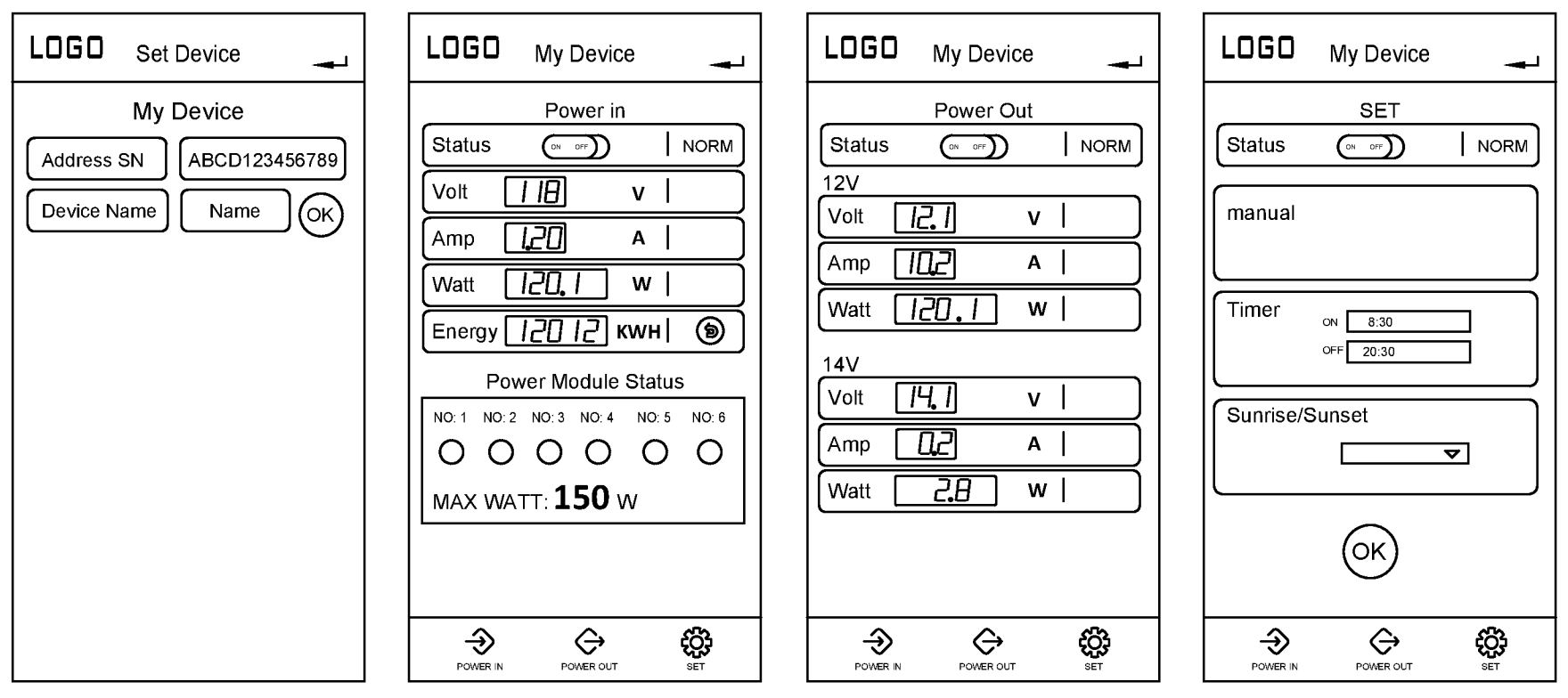

FIG. 12E is a screenshot showing the area where you can set a name to the connected device.

FIG. 12F is a screenshot showing the input power status page of the application.

FIG. 12G is a screenshot showing the output power status page of the application.

FIG. 12H is a screenshot showing the varying configurations and selections of timers.

The transformer modules 18 are dimensioned to be contained within the frame assembly 20 and slide into slots 16 via the spaced rails 24. The system may be utilized to power any low voltage system that may need a reconfigurable wattage as an upgrade or downgrade as power requirements vary for an installation. By way of non-limiting example, the system may be utilized in an irrigation control system, power security system, lighting, and other such systems.

The system of the present invention may include at least one computer with a user interface. The computer may include any computer including, but not limited to, a desktop, laptop, and smart device, such as a tablet and smartphone. The computer includes a program product including a machine-readable program code for causing, when executed, the computer to perform steps. The program product may include software which may either be loaded onto the computer or accessed by the computer. The loaded software may include an application on a smart device. The software may be accessed by the computer using a web browser. The computer may access the software via the web browser using the internet, extranet, intranet, host server, internet cloud and the like.

The computer-based data processing system and method described above is for purposes of example only, and may be implemented in any type of computer system or programming or processing environment, or in a computer program, alone or in conjunction with hardware. The present invention may also be implemented in software stored on a non-transitory computer-readable medium and executed as a computer program on a general purpose or special purpose computer. For clarity, only those aspects of the system germane to the invention are described, and certain product details well known in the art are omitted. For the same reason, the computer hardware is not described in further detail. It should thus be understood that the invention is not limited to any specific computer language, program, or computer. It is further contemplated that the present invention may be run on a stand-alone computer system, or may be run from a server computer system that can be accessed by a plurality of client computer systems interconnected over an intranet network, or that is accessible to clients over the Internet. In addition, many embodiments of the present invention have application to a wide range of industries. To the extent the present application discloses a system, the method implemented by that system, as well as software stored on a computer-readable medium and executed as a computer program to perform the method on a general purpose or special purpose computer, are within the scope of the present invention. Further, to the extent the present application discloses a method, a system of apparatuses configured to implement the method are within the scope of the present invention.

It should be understood, of course, that the foregoing relates to exemplary embodiments of the invention and that modifications may be made without departing from the spirit and scope of the invention as set forth herein.

Other embodiments and configurations may be devised without departing from the spirit of the invention and the scope of the appended claims.

The invention claimed is:

1. A modular power supply system, comprising:
a) an enclosure;
b) a casing assembly contained within said enclosure, said casing assembly including, a plurality of slots;
wherein said casing assembly is configured to accept a plurality of transformer modules configured to slide into said slots, each of said transformer modules being of a type having:
  i. a transformer module housing having a handle; and,
  ii. a transformer element positioned within said transformer module housing, wherein said casing assembly includes a plurality of printed circuit boards including a controller printed circuit board (PCB), said controller PCB, comprising
a plurality of PCB components, including:
  a) an MCU (Microcontroller Unit) configured to execute machine-readable program code for causing, when executed, a computer to perform selected steps;
  b) a relay operatively connected to said MCU, for shutting off the power to the transformer modules;
  c) at least two output current transformers (CT's) operatively connected to said MCU for measuring an output current of the modular power supply system; and,
  d) an input current transformer (CT) operatively connected to said MCU to measure an input current of the modular power supply system; and,
a PCB mounted transformer operatively connected to said PCB components, said PCB mounted transformer having a high voltage AC input and a low voltage AC output, the low voltage AC output being converted to DC to power said PCB components,
wherein said casing assembly, further comprises:
a) a frame assembly comprising a plurality of panel elements;
b) a plurality of spaced rails defining said plurality of slots, said spaced rails being supported by said panel elements;
c) a plurality of terminal blocks supported by said panel elements; and,
d) said plurality of printed circuit boards connected to said panel elements;
wherein said plurality of printed circuit boards, comprises a connection PCB, said connection PCB, comprising a plurality of pluggable terminal sets operatively connected in parallel to each other, one of the sets providing inputs to the transformer module and the other set is to provide outputs to said terminal blocks, said controller PCB and said connection PCB being substantially perpendicular;
wherein said parallel connected pluggable terminal sets provide the capability for the transformer modules to be easily added or removed from the modular power supply system to increase or decrease the power capacity thereof, thus the transformer element functions to power up a resistive or inductive load.

2. The modular power supply system of claim 1, further including the plurality of transformer modules.

3. The modular power supply system of claim 1, wherein said plurality of PCB components further includes:
a) a Bluetooth or Wi-Fi Module operatively connected to said MCU for communicating with a smartphone app; and,
b) an alarm connected to said MCU for making a buzzing or beeping noise for certain conditions.

4. The modular power supply system of claim 3, wherein said plurality of pluggable terminal sets comprises female pluggable terminal sets.

5. The modular power supply system of claim 1 wherein said casing assembly is configured to accept a plurality of single phase, toroidal transformer modules.

* * * * *